(12) United States Patent
Chen

(10) Patent No.: US 7,786,572 B2
(45) Date of Patent: Aug. 31, 2010

(54) SYSTEM IN PACKAGE (SIP) STRUCTURE

(75) Inventor: Hsien-Wei Chen, Sinying (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 739 days.

(21) Appl. No.: 11/225,648

(22) Filed: Sep. 13, 2005

(65) Prior Publication Data

US 2007/0057357 A1   Mar. 15, 2007

(51) Int. Cl.
  H01L 23/34   (2006.01)
  H01L 21/00   (2006.01)
(52) U.S. Cl. .................. 257/724; 257/738; 257/777; 257/778; 257/E23.021; 257/E21.511; 438/109
(58) Field of Classification Search .................. None
  See application file for complete search history.

(56) References Cited

U.S. PATENT DOCUMENTS

| | | | |
|---|---|---|---|
| 5,399,898 A * | 3/1995 | Rostoker | ............ 257/499 |
| 5,471,011 A | 11/1995 | Maslakow | |
| 5,801,448 A | 9/1998 | Ball | |
| 6,075,712 A * | 6/2000 | McMahon | ............ 361/783 |
| 6,168,960 B1 | 1/2001 | Li | |
| 6,404,062 B1 | 6/2002 | Taniguchi et al. | |
| 6,407,456 B1 * | 6/2002 | Ball | ............ 257/777 |
| 6,509,638 B2 * | 1/2003 | Fujimoto et al. | ............ 257/686 |
| 6,740,582 B2 | 5/2004 | Siniaguine | |
| 6,747,347 B2 | 6/2004 | Farrar et al. | |
| 6,862,189 B2 * | 3/2005 | Higuchi | ............ 361/767 |
| 6,894,398 B2 * | 5/2005 | Pon | ............ 257/786 |
| 6,914,259 B2 * | 7/2005 | Sakiyama et al. | ............ 257/48 |
| 7,034,388 B2 * | 4/2006 | Yang et al. | ............ 257/686 |
| 7,078,818 B2 * | 7/2006 | Fujimoto et al. | ............ 257/777 |
| 7,132,752 B2 * | 11/2006 | Saeki | ............ 257/777 |
| 7,262,506 B2 * | 8/2007 | Mess et al. | ............ 257/777 |
| 2002/0050635 A1 * | 5/2002 | Ogura et al. | ............ 257/686 |
| 2004/0080036 A1 | 4/2004 | Chang et al. | |
| 2004/0085796 A1 | 5/2004 | Tatsumi | |
| 2004/0251531 A1 | 12/2004 | Yang et al. | |

* cited by examiner

*Primary Examiner*—Alonzo Chambliss
(74) *Attorney, Agent, or Firm*—Slater & Matsil, L.L.P.

(57) ABSTRACT

A System In Package (SIP) arrangement and method of connecting a plurality of flip chips and wire bond chips with reduced wiring complexity and increase flexibility. The SIP arrangement includes at least one wire bond chip and at least one flip chip.

6 Claims, 16 Drawing Sheets

SYSTEM IN PACKAGE (SIP) STRUCTURE

TECHNICAL FIELD

The present invention is related to integrated circuit packaging and more specifically to systems in package (SIP) arrangements using flip chips (FC) and wire bond (WB) integrated circuits having conductive lines or traces on the top side of the chip. On flip chips, the conductive lines or traces are opposite the bump contacts, and on the wire bond chips, they are on the same side as the wire terminations.

BACKGROUND

Assembling several ICs required by a system in a single package is now a common practice for complex electronic systems, and is often referred to as a SIP (System In Package). Using a SIP assembly results in improved performance, less cost, and reduced size or dimension of an electronic system. Early SIP technology was based on wire bond structure or chips. However, as the number of different ICs in an electronic system increased or became more complex, the large number of wire bonds is almost unmanageable, and, making hundreds of closely spaced wire bond connections is very difficult. Furthermore, such complex wire bond arrangements are prone to breaks and/or shorts between wire bonds.

The prior art FIG. 1 is an actual photograph showing the resulting complexity of wire bonding or connecting two stacked wire bond chips to a support substrate or connection surface. Consequently, more and more ICs are being manufactured as FC's (flip chips) to help simplify the connections of a SIP. However, WB (wire bond) IC chips are still economically appropriate for many uses. Further, the cost of designing and manufacturing a FC, having the circuits that are already available on a WB type chip may not be economically worthwhile in many situations. Therefore, as SIP complexity increases, it would be advantageous if existing WB chips could be combined with available FC circuits. Furthermore, even FC interconnecting technology has become difficult.

Therefore, effective techniques for interconnecting large numbers of ICs in a SIP structure with minimal wire bonds would be advantageous.

SUMMARY OF THE INVENTION

The issues discussed above are addressed by the present invention, which generally comprises a plurality of IC chips interconnected in a package having at least a stack of two levels of such electronic chips electrically connected to a connecting surface or substrate and wherein at least one of the stacked electronic chips is a wire bond chip (WB) and at least one is a flip chip (FC).

According to one embodiment, an electronic package comprises a stack of electronic circuit chips that includes at least one wire bond chip, and at least one flip chip. The remainder of the chips in the stack can be either a WBC (wire bond integrated circuit) or a FC (flip chip).

If the first level chip is a flip chip, the connection surface or substrate will define contact pads for electrically connecting the flip chip. The flip chip will have an active side and a back side and comprises first electrical circuits connected to a multiplicity of bump contacts on the active side. These bump contacts are arranged according to a pattern that is substantially a mirror image of the pattern of contact pads provided on the substrate. The bump contacts on the flip chip are then positioned so that they are in electrical contact with the contact pads on the connection surface or substrate. The back side of the flip chip further defines a multiplicity of wire bond pads. As mentioned above, the package will also include at least one wire bond chip, which will be on a higher level of the stack. The wire bond chip will comprise second electric circuits, which are connected to second wire bond pads on a connection side or top side of the wire bond chip. Third and subsequent chips of the stack may be either flip chips or wire bond chips and there may also be included electrical connections from the electronic chip on the second level, whether a flip chip or wire bond chip, to the first flip chip and also electrical connections from the electronic chip on the third level to the electronic chip on the second level. Further, if the wire bond chip (WB) is on the second level of a stack of three chips, then the connection surface or substrate will define additional wire bond pads and further comprise at least one wire or electrical connection from one of the at least one multiplicity of wire bond pads on the first wire bond chip to one of the additional contact pads on the connection surface or substrate.

Another embodiment of the invention includes arrangements of a stack of ICs wherein the lower or first level IC is a wire bond chip, and one of the upper ICs is the at least one flip chip. Then as was the case in the first embodiment, the remaining levels can be either another flip level chip or another wire bond chip. In both of the embodiments, whether the first level chip is a flip chip or whether the first level chip is a wire bond chip, it will be appreciated by those skilled in the art that there will be a large number of connection options not possible in the prior art. For example, both the flip chips and the wire bond chips may include contact pads. That is, there may be included contact pads on the top side of the wire bond chip, and on the back side of the flip chip. The contact pads are connected to wire bond pads on the same side by means of electrically conductive traces between the two. The pattern of these contact pads is selected to receive and make electrical contact with another flip chip having bump contacts, which bump contacts are a mirror image of the pattern of the contact pads.

Still other embodiments include even more complex electronic packages that comprise at least two SIP packages of the type disclosed in the above embodiments.

The foregoing has outlined rather broadly the features and technical advantages of the present invention in order that the detailed description of the invention that follows may be better understood. Additional features and advantages of the invention will be described hereinafter, which form the subject of the claims of the invention. It should be appreciated by those skilled in the art that the conception and specific embodiment disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawing, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

Figure 1:
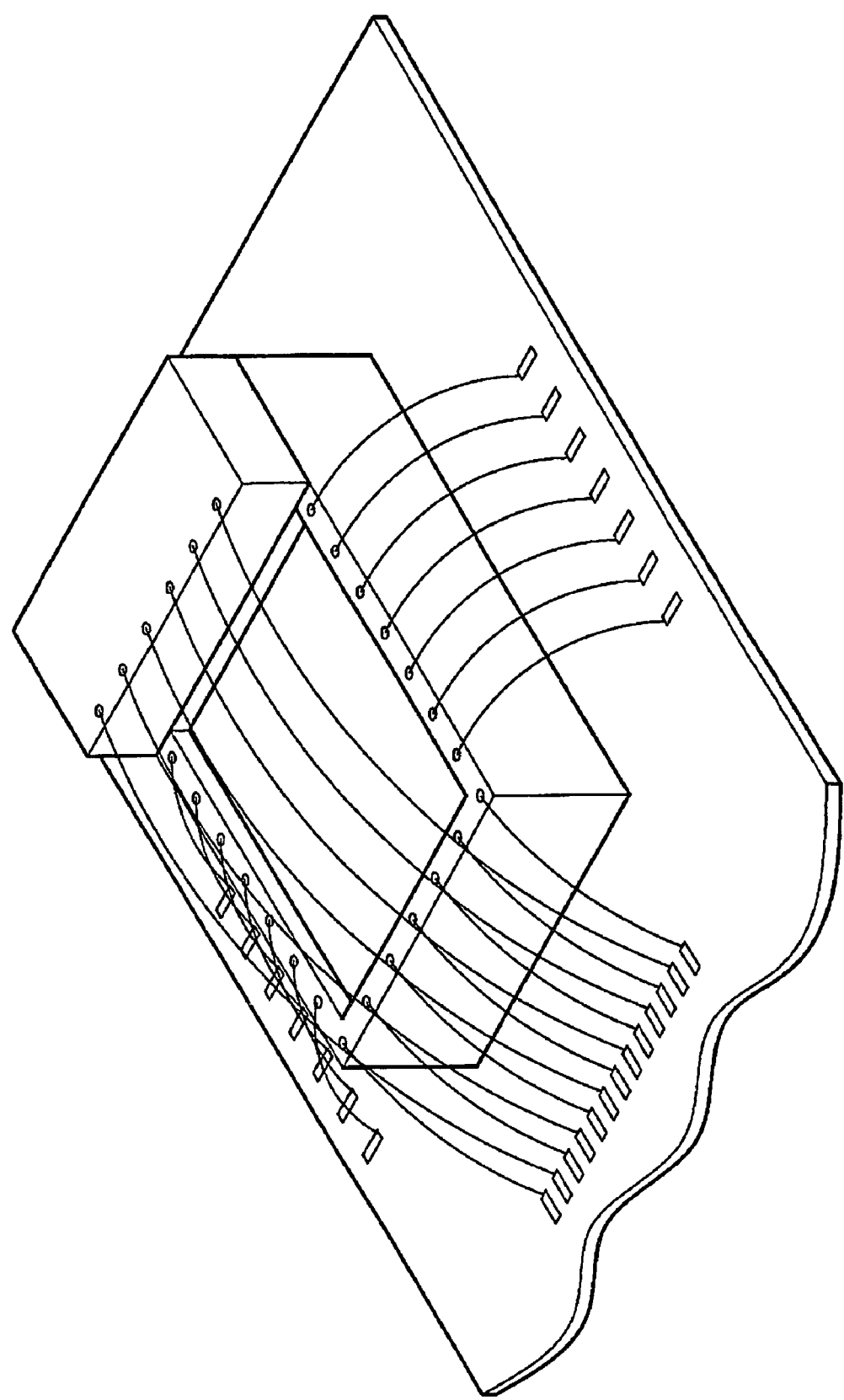
FIG. 1 shows the maze and complexity of wire bonds now on many IC systems.
Figure 2:
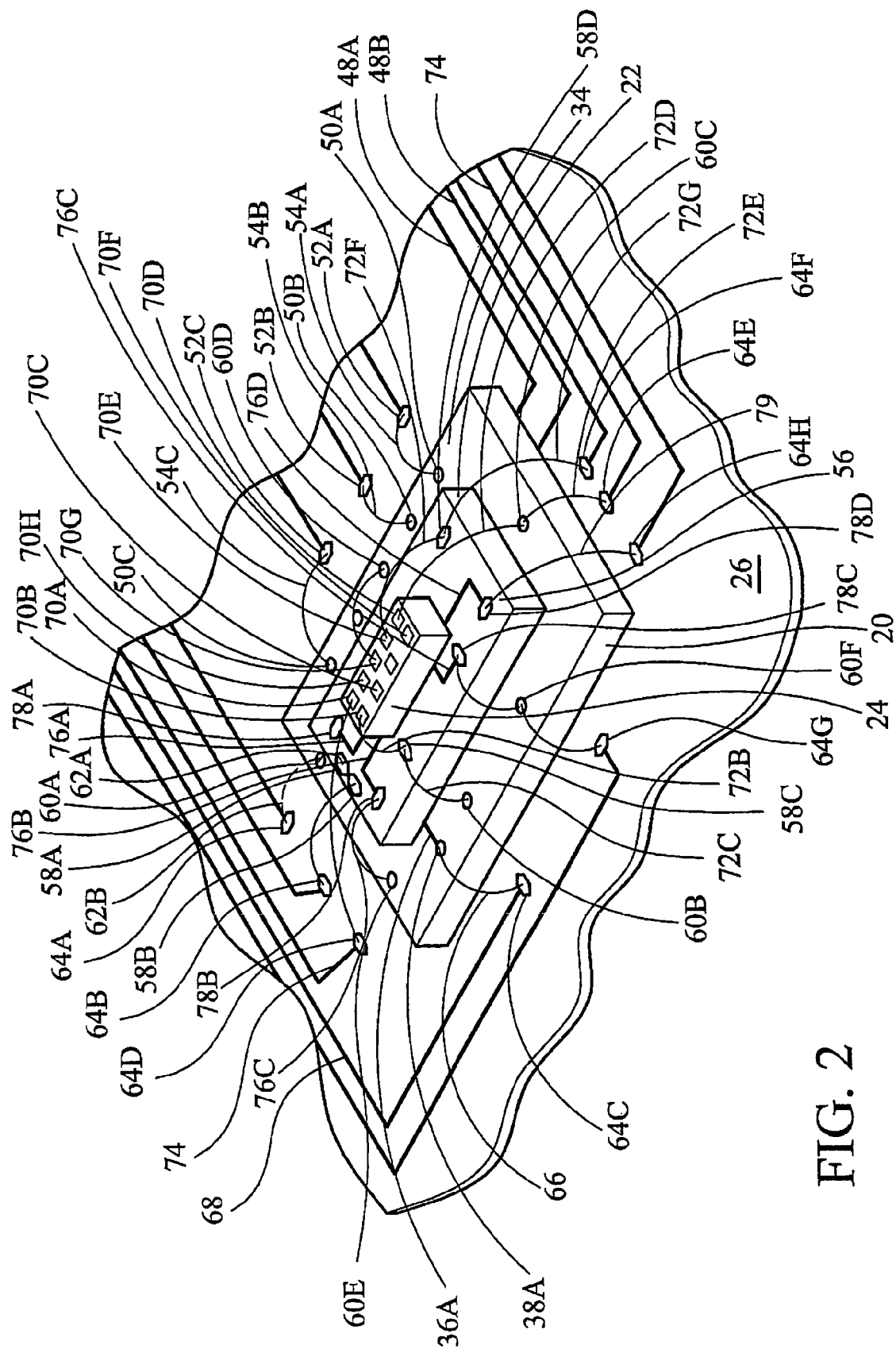
FIG. 2 illustrates a stack of three IC chips on a substrate or connection surface and the various possible connections available on various SIP arrangements according to the present invention.

Referring now to FIG. 2, there is illustrated a stack of three IC chips 20, 22, and 24 mounted to a substrate or connecting surface 26 such as a PC board. There is also shown the various connections made possible by different arrangements of flip chips and wire bond chips according to the present invention. As will be discussed in detail later, each of the three chips 20-24 may be either a flip chip or a wire bond chip. However, except for an embodiment discussed later that is comprised of three flip chips and shown in FIG. 20A or 20B or both, each arrangement of the three chips will include at least one flip chip and at least one wire bond chip.

The arrangement shown in FIG. 2 illustrates connections at each level that are possible with various combinations of both flip chips and wire bond chips and therefore it should be appreciated that FIG. 2 is for discussion and illustration only. Prior to discussing the many and various IC chips, arrangements, and their connection, refer now to FIGS. 3A, 3B, 3C, 4A, 4B, and 5.

Figures 3A, 3B, 3C:
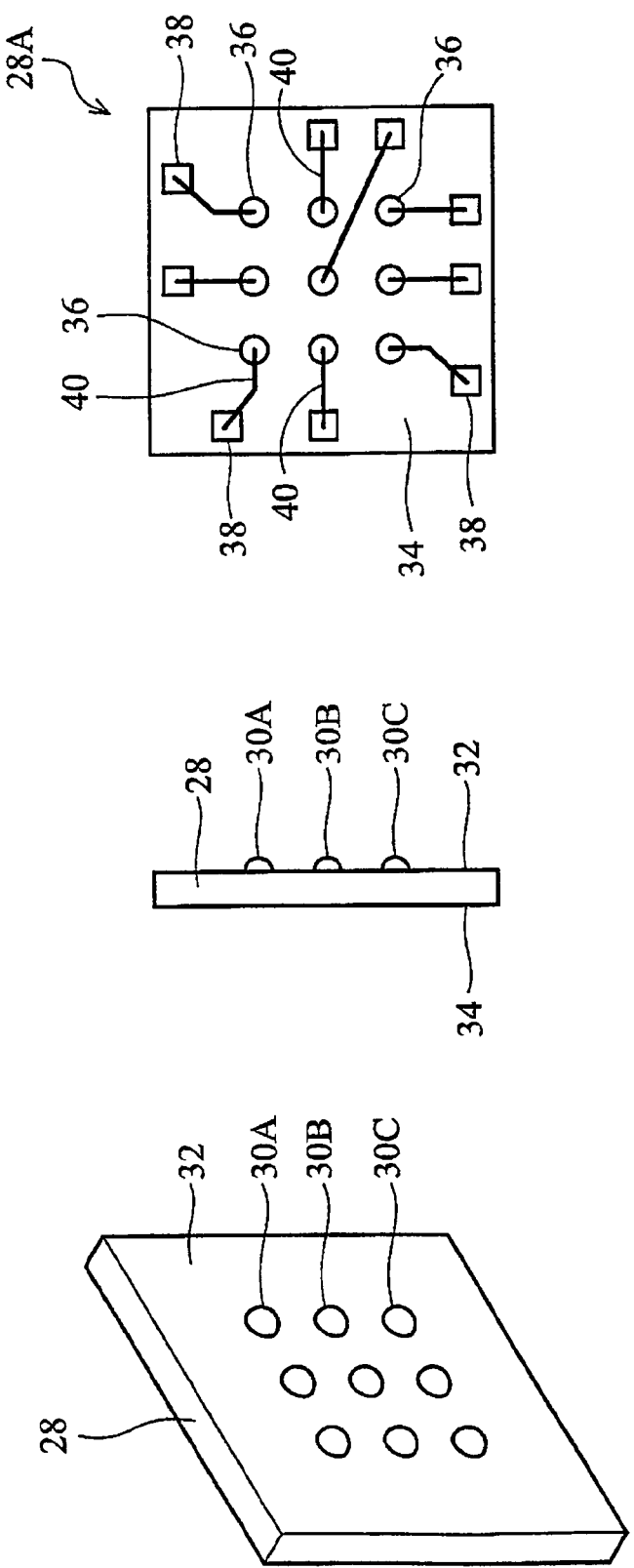
FIGS. 3A and 3B illustrate a simplified prior art bottom view and side view respectively of a FC with bump contacts.
FIG. 3C illustrates a FC similar to that of FIGS. 3A and 3B with conductive traces on the back side of the FC.

FIG. 3A is a prior art simplified top perspective view and FIG. 3B is a side view illustrating flip chip 28, and showing the bump contacts 30a, 30b, and 30c on the bottom or active side 32. As will be appreciated by those skilled in the art, bump contacts 30a-30c are connected to selected electronic circuits (not shown) comprising the flip chip 28. Further, although flip chip 28 shows a small number (nine) of bump contacts, it will be appreciated that the number of bump contacts may be significantly greater than nine. It will also be appreciated that the terminology such as "top side", or "back side", or "bottom side" is for convenience only and to aid understanding of the invention since the flip chip circuits could be mounted in substantially any spatial orientation, including upside down.

FIG. 3C illustrates a flip chip 28a similar to that of FIGS. 3A and 3B, except the back side 34 of the flip chip 28a includes contact pads 36, wire bond pads 38, and traces 40 connecting one each of the contact pads to one each of the wire bond pads. The term "back side" is used herein only with respect to flip chips, and refers to the side of the flip chip opposite the bottom side that has the bump contacts.

Figures 4A, 4B, 4C:
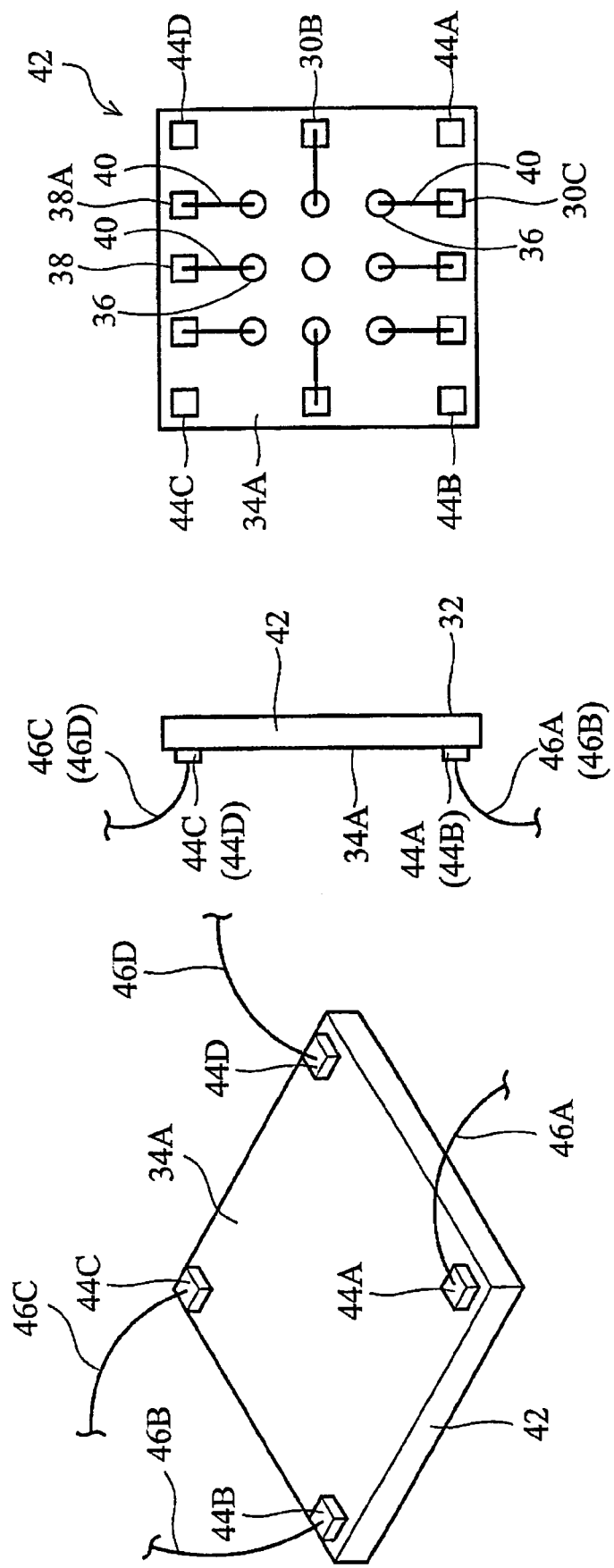
FIGS. 4A and 4B illustrate a perspective view of the top side and a side view respectively of a simplified prior art wire bond chip with wire bond contact pads on the top side.
FIG. 4C illustrates a wire bond chip similar to that in FIGS. 4A and 4B further including conductive pads, traces, and terminals for connecting with a flip chip.

FIGS. 4A and 4B illustrate a prior art simplified top perspective view and a side view respectively of a wire bond chip 42 showing a first set of wire bond pads 44a-44d on the top side 34a of wire bond chip 42. Pads 44a-44d include connecting wires 46a and 46d bonded to the pads. The term top side is used herein only with respect to wire bond chips. FIG. 4C illustrates how the top side 34a of the wire bond chip may also include a plurality of contact pads 36, a second set of wire bond pads 38, and traces 40. It will be appreciated that including contact pads 36, traces 48, and the second set of wire bond pads 38 will, of course, increase the complexity of the top 34a of the wire bond chip. However, these contact pads, traces, and wire bond pads will also increase the flexibility of combining wire bond chips and flip chips in a combination stack.

Figure 5:
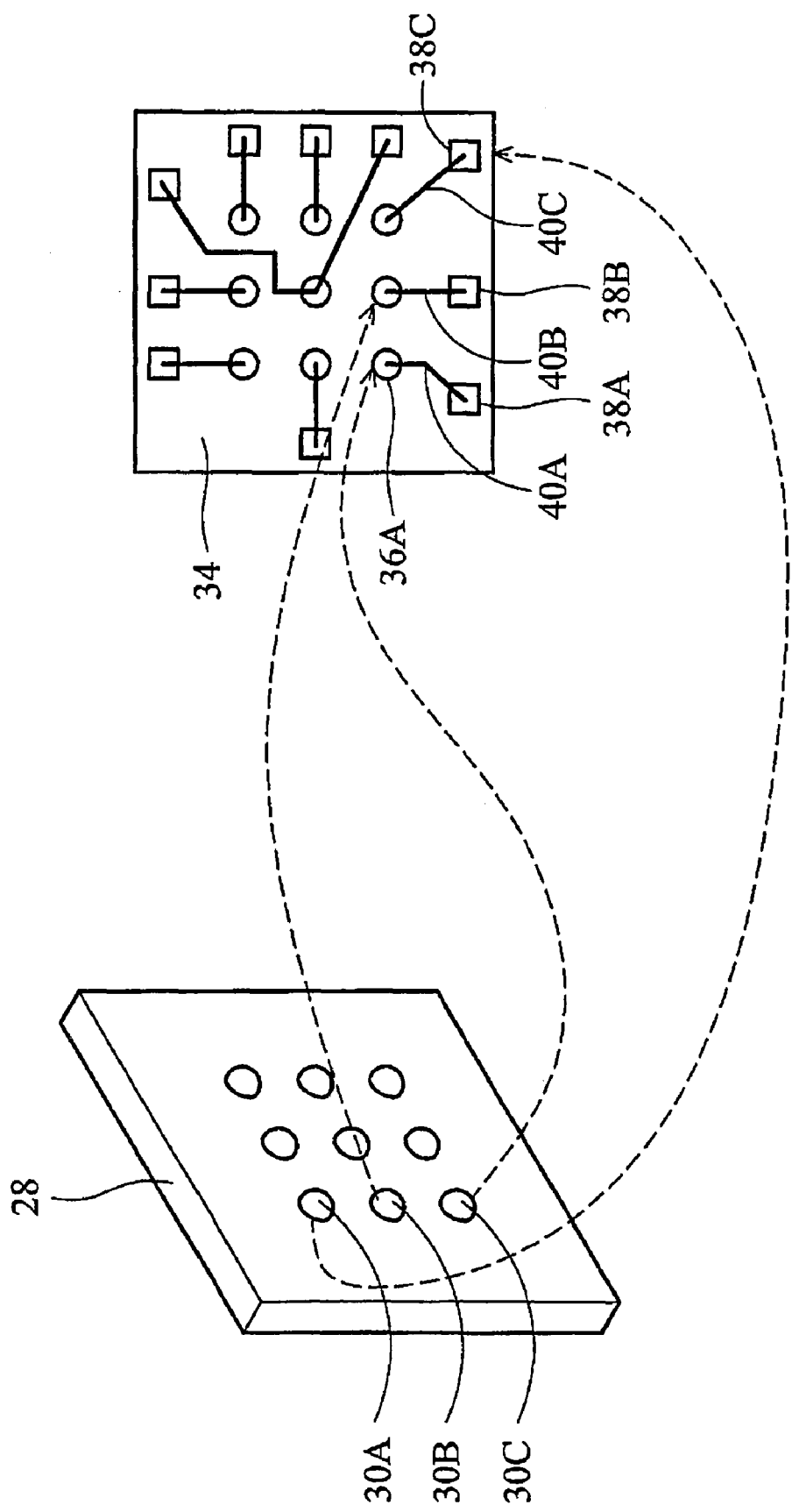
FIG. 5 illustrates how the bump contacts of a FC (flip chip) make contact with the contact pads on the back side of a FC, or a wire bond chip of the type shown in FIG. 4C or the contact pads on a substrate or connecting surface.

The dashed lines of FIG. 5 illustrates how the flip chip 28 having bump contacts 30a, 30b, and 30c is positioned against the contact pads on a substrate or connection surface, the contact pads on the back side of a flip chip or the contact pads on the top side of a wire bond chip. Thus it will be appreciated that the contact pad pattern is a mirror image of the bump contacts of a flip chip such that electrical contact is made between bump contacts 30a, 30b, and 30c and contact pads 36a, 36b, and 36c respectively. Electrically conductive traces 40a, 40b, and 40c then provide electrical connections from the contact pads 38a, 38b, and 38c to the wire bond pads 38a, 38b, and 38c respectively.

Therefore, referring again to FIG. 2, various possible connections will be discussed. For example, if the bottom chip 20 is a flip chip, then there will be bump contacts on the bottom side of the flip chip, which make electrical connections with contact pads on the substrate or connecting surface 26. Therefore as shown in FIG. 2, there are a pair of conductive traces or leads 48a and 48b, extending from the contact pads (not shown) out from under the flip chip 20 to connections that will be made to the conductive traces. If the integrated circuit 20 as shown in FIG. 2 is a wire bond chip, then, there will be included wire bond pads such as wire bond pads 50a, 50b, and 50c located on the top side or surface of the first level wire bond chip. The wire bond pads 50a, 50b, and 50c are in turn connected to other electrical traces 52a, 52b, and 52c on top of substrate 26 by means of connecting wires 54a, 54b, and 54c. Therefore, it can be seen that either a wire bond chip or a flip chip may be used as the first level chip 20 according to the invention.

If the second level chip 22 is a wire bond chip and the first level chip is a flip chip as was discussed above, then, it will be appreciated that there will need to be connections made from the second level chip 22 to either the first level chip 20 or the substrate or connecting surface 26. Therefore, if the second level chip is a wire bond chip, there will be included on the top side 56 of the second level chip 22 a plurality of wire bond pads such as wire bond pads 58a, 58b, 58c, and 58d. It will be appreciated, of course, there may be substantially more than the four wire bond pads 58a-58d as shown. In the embodiment illustrated, the wire bond pad 58a is connected to another wire bond pad 60a on the top surface of the first level chip 20, (which may be either a flip chip or a wire bond chip), by means of another connecting wire 62a. The wire bond pad 60a may simply serve as an intermediate stop for another wire connection 62b from the wire pad 60a to a contact pad 64a on the top surface of substrate or connecting surface 26 as indicated by dashed lines 62b. Alternately, wire bond pad 60a may be directly connected to a circuit (not shown) comprising part of the first level chip 20 such that circuits on first level chip 20 and second level chip 22 may be interconnected. Also as shown, there may be a second wire bond pad 58b on the top side of the second level chip 22, which is connected directly to another contact pad 64b on substrate or contact surface 26. The wire bond pad 58c also on the top side 56 of the second level chip 22 will be discussed later with respect to the third level chip 24.

Therefore, now assuming that the second level chip 22 is also a flip chip, it will be appreciated that the back side 34 of the first level chip 20 will include contact pads, traces, and wire bond pads similar to the contact pads 36, traces 40, and wire bond pads 38 as discussed in FIG. 3C. Therefore, referring again to FIG. 2, it is seen that a trace 36a extends out from under the second level chip 22 (which is another flip chip) to a terminal point 38a. Terminal point 38a may then be connected to another contact pad 64c on the top surface of substrate or connecting surface 26 by means of a connecting wire 66. As shown, the contact pad 64c on the surface of substrate 26 is in turn connected to an electrically conductive trace 68 for selected outside connections. Referring now to the third level chip 24 and as was discussed above, it will be appreciated that this third level chip may either be another flip chip or another wire bond chip. Therefore, if the third level chip 24 is a second wire bond chip, there are shown a plurality of wire bond pads 70a-70h. Three of the pads, 70c, 70f, and 70h are shown unconnected, however, the other pads 70a, 70b, 70d, 70e, and 70g, and 70h will be discussed. As shown, wire bond pad 70a is connected directly to a contact pad 64d on the top surface of substrate 26 by a bond wire connection 72a. Further as shown, there is an electrical trace 74 leading to an outside connection. In addition to the direct connection between the third level chip 24 and the substrate or connecting surface 26, there is also shown a wire bond connection 72b between the wire bond pad 70b on third level chip 24 and the wire bond pad 58c on the top side 34a (if a wire bond chip) or back side 34 (if a flip chip) of the second level chip 22. In the embodiment shown wire bond pad 58c is further connected to a wire bond pad 60b on the top side 34a or back side 34 of the first level chip 20 by means of connecting wire 72c. Thus, it is seen that the wire bond pad 58c may simply be an intermediate connection from the wire bond pad 70b on the third level chip to the wire bond pad 60b or wire bond pad 58c could possibly be connected to one of the circuits (not shown) comprising a portion of the circuits of the second level chip 22. Likewise, the wire bond pad 60b of the first level chip 20 could also be connected to circuits (not shown) comprising a portion of the first level chip 20.

Further as shown, there may be a direct wire connection from wire bond pad 70d by connecting wire 72d bypassing the second level chip completely to a wire pad 60c on the top side 34a (if a wire bond chip) or back side 34 (if a flip chip) of the first level chip 20. Also as shown, there may be a wire bond connection 72e between the wire bond pad 60c of first level chip 20 to the top surface of the substrate or connecting surface 26 to a contact pad 64e. As was discussed previously, contact 64e may be connected to a conductive trace 74 for selected connections to the outside or other systems. Yet another connection may comprise a wire bond connection from wire bond pad 70e on the top of third level chip 24 to wire bond pads 58d on second level chip 22 by means of connecting wire 72f. Wire bond pad 58d may then in turn be connected to a contact pad 64f on the connecting surface 26 by another connecting wire 72g. Finally, there may be a wire connection between wire bond pad 70g on the third level chip 24 which bypasses the second level chip 22 and is bonded directly to a wire bond pad 60d on first level chip 20.

Another arrangement wherein the third level chip 24 is a flip chip is now discussed. As shown, if the third level chip 24 is a flip chip, the top side 56 of the second level chip 22 will include traces extending from contact pads under the third level chip (not shown) from under the chip to additional wire bond pads on the top surface 56. Therefore as shown, there is a trace 76a extending from under the third level chip to a wire bond pad 78a on the top surface of the second level chip 22. According to this connection there is no further wire connection from wire bond pad 78a and such a connection might be useful if the wire bond pad 78a was connected directly to a portion of the circuitry in the second level chip 22. There is also shown a second conductive trace 76b extending from underneath the third level chip 24 to a wire bond pad 78b also on the top surface of the second level chip 22. There is further included a connecting where 76c bonded to pad 78b and extending to a wire bond pad 60e on the top surface of the first level chip 20. Such a connection could, for example, connect a circuit in the third level chip to circuits in both the first level chips and second level chips.

A third conductive trace 76c extending from underneath the third level chip 24 extends to a wire bond pad 8 of the first level chip 20 and in turn to a contact pad 64g, which is connected to another electrical trace on the surface of substrate 26 to outside circuitry. Another trace 76d extends to another wire bond pad 78d, which is in turn connected directly to another contact pad 64h on the surface of the substrate or connection surface 26 by connecting wire 79.

Thus, it is seen that according to the teachings of the present invention, there are a very large number or variety of connection techniques between the three levels of integrated circuit chips, no matter whether the chips are flip chips or wire bond chips.

Figure 6:
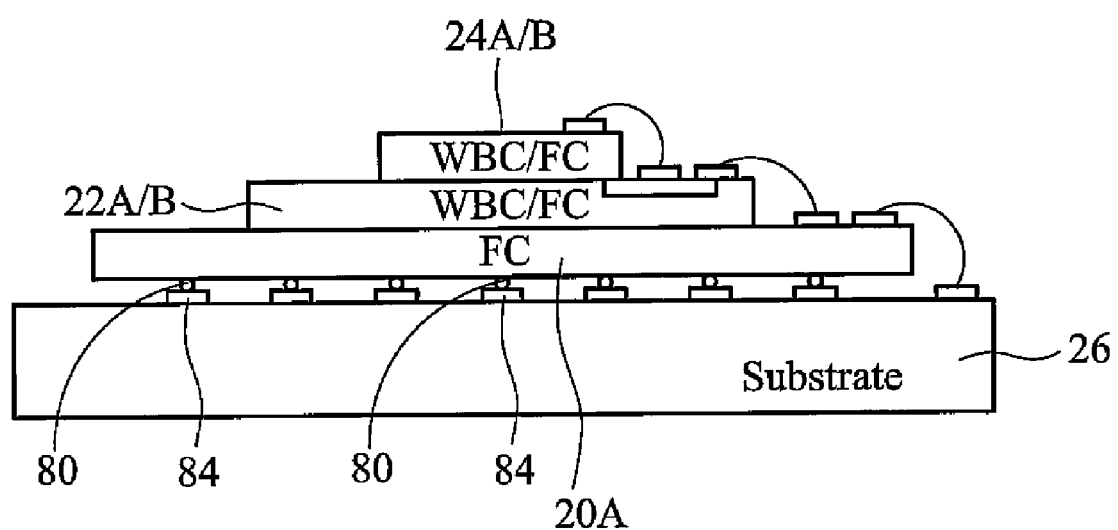
FIG. 6 illustrates a first embodiment of the invention wherein the first level IC is FC.

Referring now to FIG. 6, there is shown a first embodiment of the invention, which will also include several variations or sub-embodiments that will be discussed hereinafter. As shown, there is the substrate 26 to which is connected a flip chip 20a having bump contacts 80, which will be arranged according to a particular pattern on the underside 82 of the flip chip 20a. The bump contacts 80 are positioned over an array of contact pads 84, which will be arranged in a pattern that is substantially the mirror image of the pattern arrangement of the bump contacts 80. These contact pads 84 are provided to outside circuits by means of conductive traces, such as conductive traces 48a, 48b, 76a, 76b, 76c, and 36 illustrated in FIG. 2. In the generalized embodiment of FIG. 6, it is seen that the second level chip 22 may either be a flip chip 22a or a wire bond chip 22b as is also the case with a third level chip 24. However, typically, one of the second or third level chips will be a wire bond chip and the other one of the second and third levels that is not the wire bond chip can be either a wire bond chip or a flip chip as was discussed above. Regardless of whether or not the second level chip 22 is a wire bond chip or a flip chip, there will be a connection between the second level and the first level chip. Likewise, regardless of whether or not the third level chip is a flip chip or wire bond chip, there will be a connection between the third level chip and the second level chip. As was discussed above, it will be appreciated that these connections may be either wire bond connections or connections through bump contacts and contact pads.

Figure 7A:
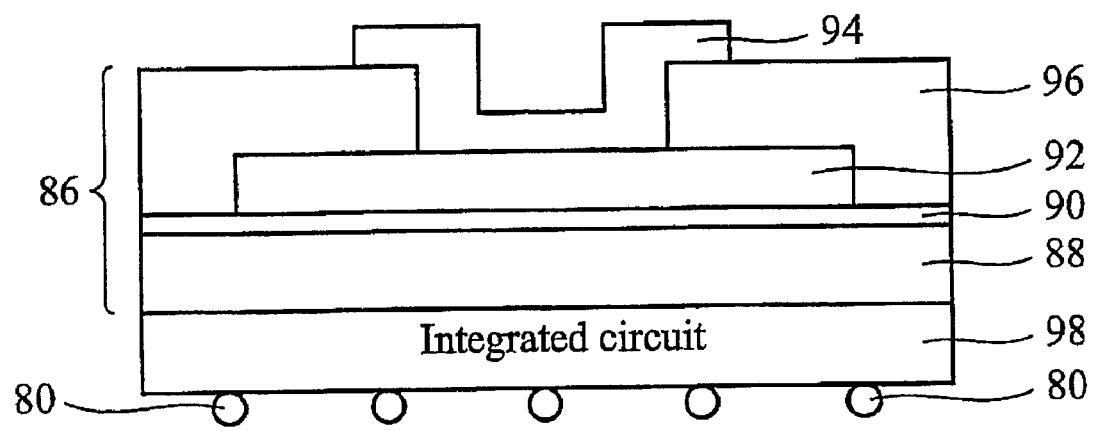
FIGS. 7A and 7B respectively show cross sections of the contact pads and traces having a dielectric cover layer on the back side of a flip chip and the top side of a wire bond chip according to the teachings of another embodiment of the present invention.
Figure 7B:
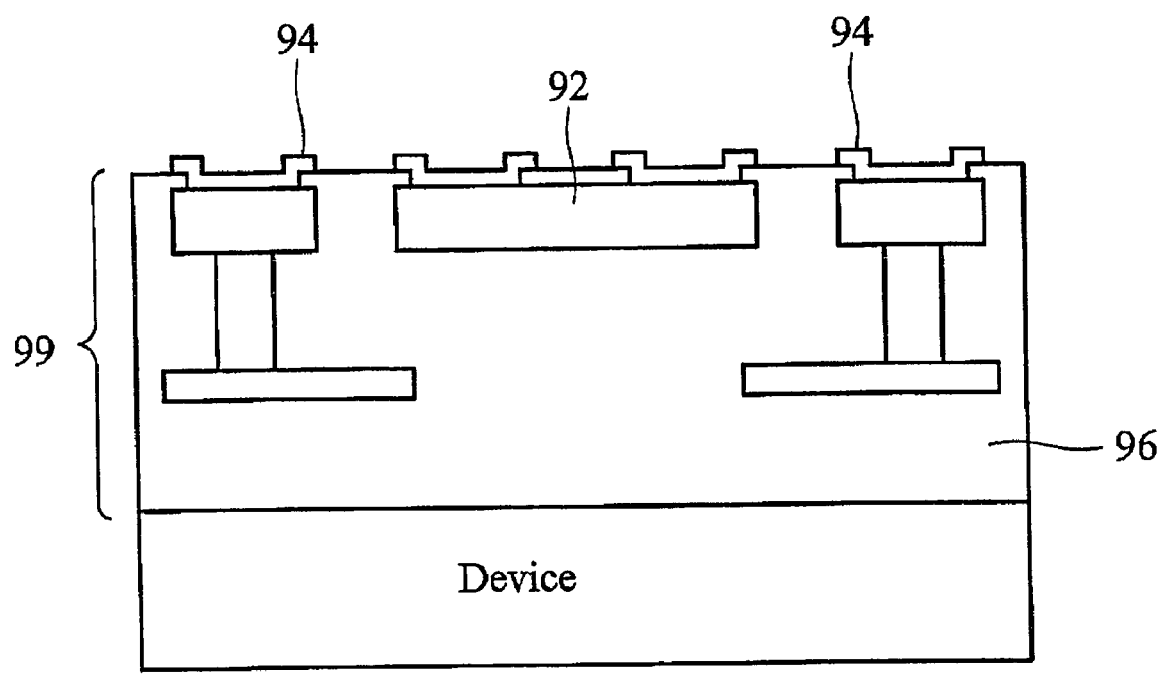

Referring now to FIGS. 7A and 7B, there is illustrated cross sectional views of contact pads and conductive traces according to the teachings of the present invention. As shown, the cross-section 86 of the back side portion of a flip chip is shown as including a buffer layer 90, a conductive traces layer 92, the contact pads 94, and a dielectric or protective film 96 formed on the back side of the semiconductor substrate 88 of the flip chip. The flip chip is also shown as including an integrated circuit 98 adjacent the semiconductor substrate 88. The integrated circuit 98 comprises active devices and an interconnect structure. The interconnect structure may comprise metal interconnect layers and inter-metal dielectric layers (IMD), preferably low dielectric constant (low-k) dielectric layer. The buffer layer 90 may be composed of silicon carbide, silicon nitride, or silicon oxide or polymer material and serves as a stress buffer material to release the high stresses resulting from the use of connecting bumps. The metallic redistribution layer or the conductive traces 92 provide an electrical connection between the contact pads 94 and other connection points on the chip such as wire bond pads. It will be appreciated that the conductive traces or metallic redistribution layer 92 can also be replaced by the pad conductive material 94 to serve as the conductive traces. Metallic layer 92 may be copper, aluminum, or any other conductive metals and alloys thereof. The dielectric film 96 will cover the metallic layers 92 and prevents direct contact of these metallic layers with the air and thereby prevents erosion and/or oxidation of the metallic conductive traces. The dielectric films 95 may comprise FSG (Fluorine doped Silicon Glass), USG (Undoped Silicon Glass), or silicon nitride. The contact pads 94 may typically be made out of aluminum but could be made out of copper or other materials and are formed in apertures selectively positioned through the dielectric film 96 such that they make contact with the metallic layers 92. Further, although the contact pad arrangement of FIG. 7 is particularly suited for use with a flip chip, the same arrangement may also be used for providing contact pads on the top side of a wire bond chip. This allows the novel arrangement of an upper layer flip chip to be electrically connected to contact pads located on the wire bond chip.

FIG. 7B illustrates the cross-section of a wire bond chip and is similar to FIG. 7A, except that the bond pads 94 of the wire bond chip are designed as part of the interconnect layer 99. Conversely, the bond pads 94 of a flip chip are designed onto the back side of the semiconductor substrate 88.

Figure 8A:
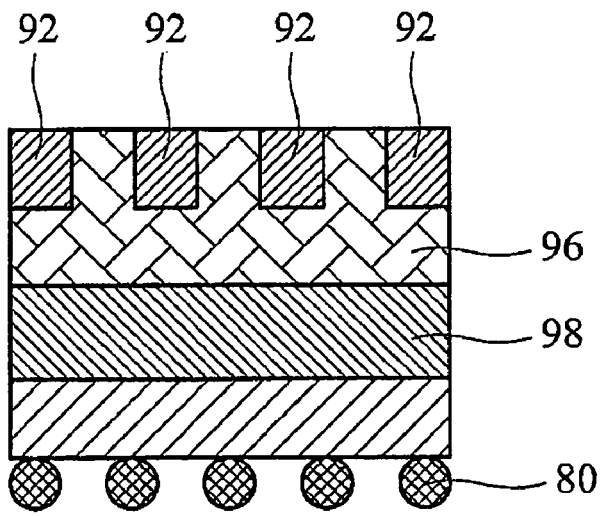
FIG. 8A is a cross section of a FC illustrating how insulating material may be deposited between and under the metallic or conductive traces and FIG. 8B illustrates how recessing the conductive connections below the top surface of the insulating material can help prevent degradation and shorting.
Figure 8B:
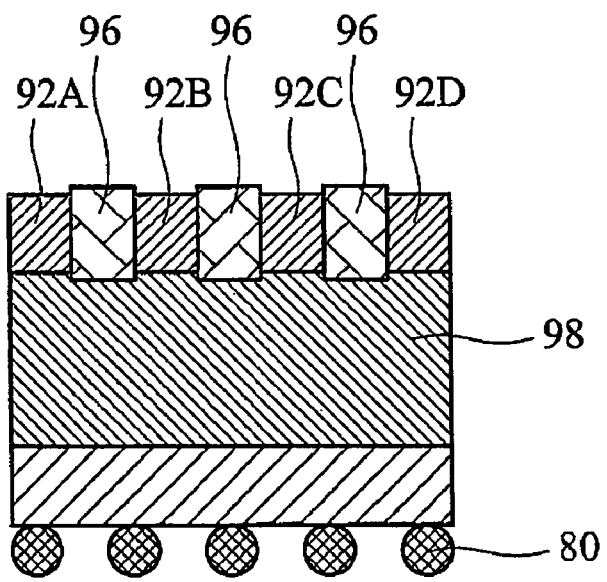

In addition, referring to FIGS. 8A and 8B, there are illustrated further embodiments for protecting the integrated circuits 98 of a flip chip from shorts from the conductive traces on the back side of the flip chip. As shown in FIG. 8A, the insulated layer 96 is both below the metallic conductive traces 92 and between the individual traces as shown. FIG. 8B, on the other hand, does not include the dielectric film 96 below the metallic traces. However, in this embodiment the metallic traces 92a, 92b, 92c, and 92d are recessed below the top surface of the dielectric layer 96 to prevent degradation and shorting of the connections and to more firmly secure a bottom level chip to an upper level chip.

Figure 9A:
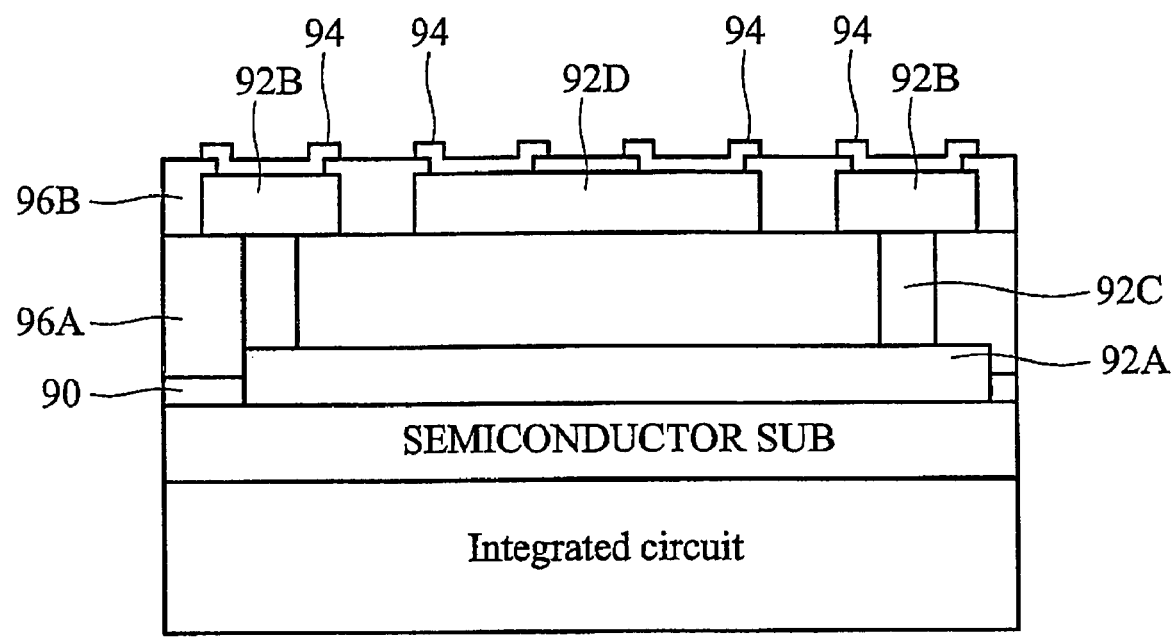
FIGS. 9A through 9C illustrated how the conductive traces on the back side of a flip chip or the top side of a wire bond chip may include multilayers of metallic such that the number of possible connections may be increased.

FIG. 9A shows still another embodiment, wherein there is more than one layer of metallic conductive traces. As shown, a first layer of metallic conductors or traces 92a are deposited and covered by a first portion 96a of the dielectric film. A second layer of metallic traces 92b is then formed on the top of the first portion 96a of the dielectric layer. The metallic vias or interconnections 92c may be used to connect the first layer of metallic traces or conductors 92a to the second layer of conductors or traces 92b. The second layer of dielectric material 96b completely covers the second layer 92b of metallic traces and apertures are then formed into the second layer 96b of dielectric material followed by the formation of the contact or contact pads 94. Although FIGS. 7A and 9A only show two layers of conductive traces, a substantially larger number of layers have been used. Thus, it will be appreciated that using two or more layers of metallic traces provides much more flexibility in the possible contact arrangements. Also as discussed above, the contact pads 94 can also be designed as the metallic redistribution layer and serve as the conductive traces.

Figure 9B:
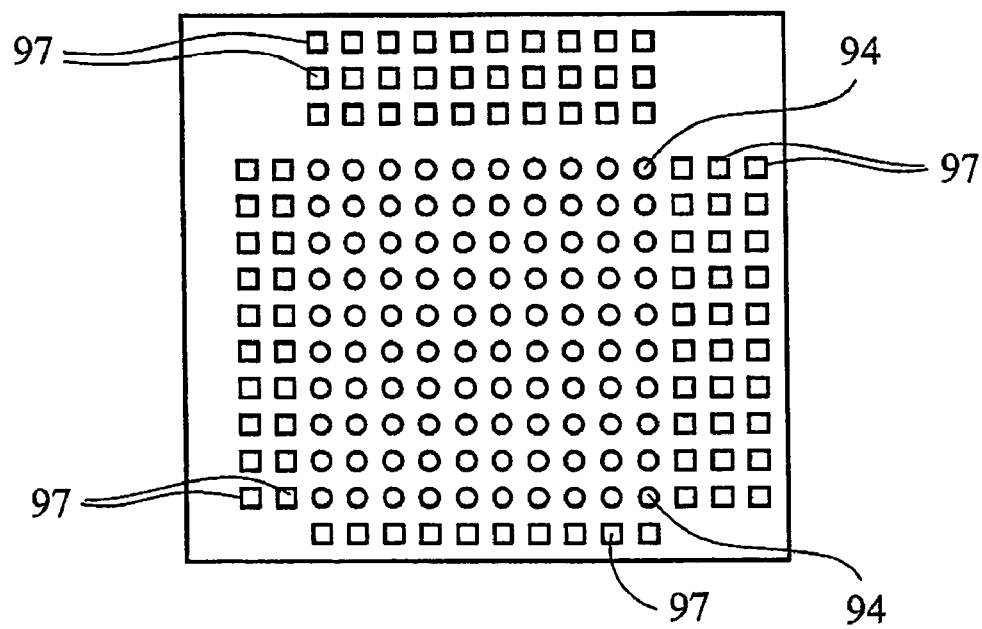
Figure 9C:
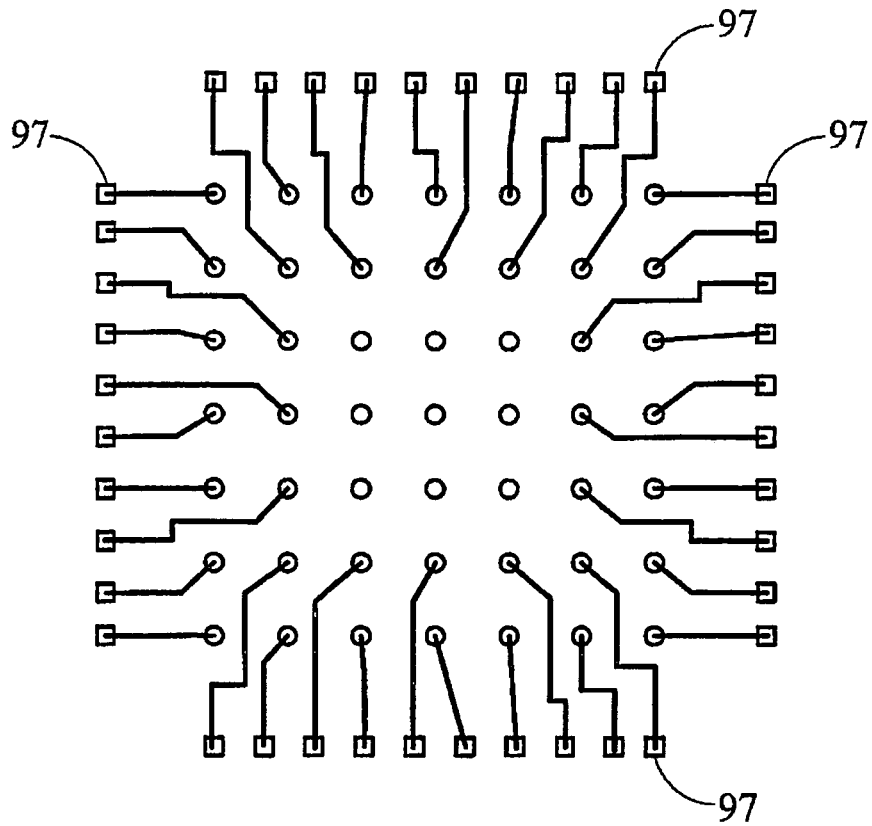

FIG. 9B illustrates as an example only, a high density terminal pad structure using the technique shown in FIG. 9A as compared to the less dense structure of FIG. 9C using single layer conductive traces. More specifically as shown in FIG. 9B, there may be two or even more rows 97 of wire bond pads on each of the four sides in the embodiment shown by using the multilayers of conductive traces as discussed with respect to FIG. 9A.

Figure 10:
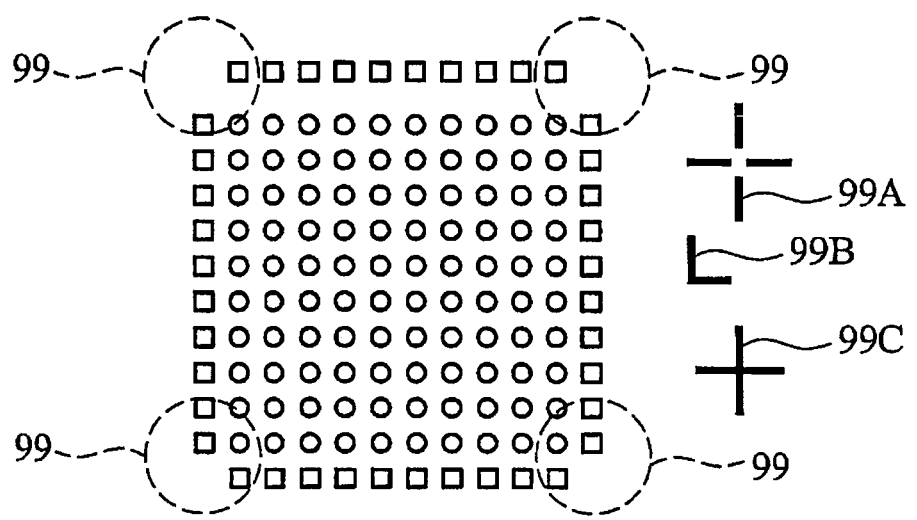
FIG. 10 illustrates the use of alignment marks on the back side of the flip chip.

In addition, by using the conductive traces and protective dielectric film 96 as discussed in the embodiments above, alignment marks, such as alignment marks 99a, 99b, and 99c, may also be included below the top level of the dielectric material such as shown at the corners 99 of FIG. 10. These alignment marks are protected and readily visible even with very complex back side or top side surfaces of chips.

Figure 11:
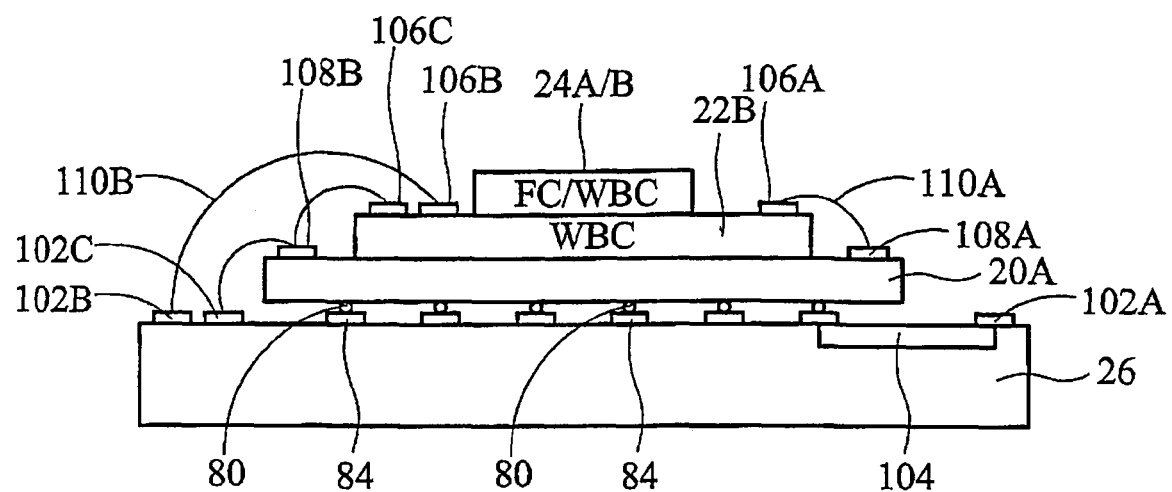
FIGS. 11-14 are side views of the basic arrangement of FIG. 6 and illustrate various chip arrangements and connections or sub-embodiments of a three IC chip stack on a substrate or connection surface that includes a flip chip on the first level and at least one wire bond chip on the second or third level according to the teachings of the present invention.

Thus, it is seen that significant improvement in the density of stacked levels of integrated circuit chips may be accomplished in accordance with the present invention. It will also be appreciated that the multilayered conductive traces such as discussed with respect to FIGS. 7A, 9A, and the large number of wire bond pads illustrated in FIG. 9B may be used on the connection side of a wire bond chip as well as the back side of a flip chip. Therefore, referring to FIG. 11, there is shown a specific version of the stack of chips discussed with respect to FIG. 6 in which the second level chip is a wire bond chip 22b. As shown in FIG. 11, the flip chip 20a is connected by it's bump connections 80 to contact pads 84, which in turn may be connected to outside connections or another wire bond pad 102a by connection or trace 104. Also as shown in FIG. 11, a wire bond pad 106a on the back side of wire bond chip 22b may be connected to wire bond pad 108a on the back side of flip chip 20a by a wire connection 110a. Alternately, another wire bond pad 106b may be connected directly to a wire bond pad 102b on the substrate or connecting surface 26 by wire 110b. Still another connection may be from a wire bond pad 106c on the top side of wire bond chip 22b to wire bond pad 108b on the back side of flip chip 20a and then to a wire bond pad 102c on substrate or connecting surface 26. Thus, it is seen that great flexibility of connections is possible using the teachings of the present invention.

Figure 12:
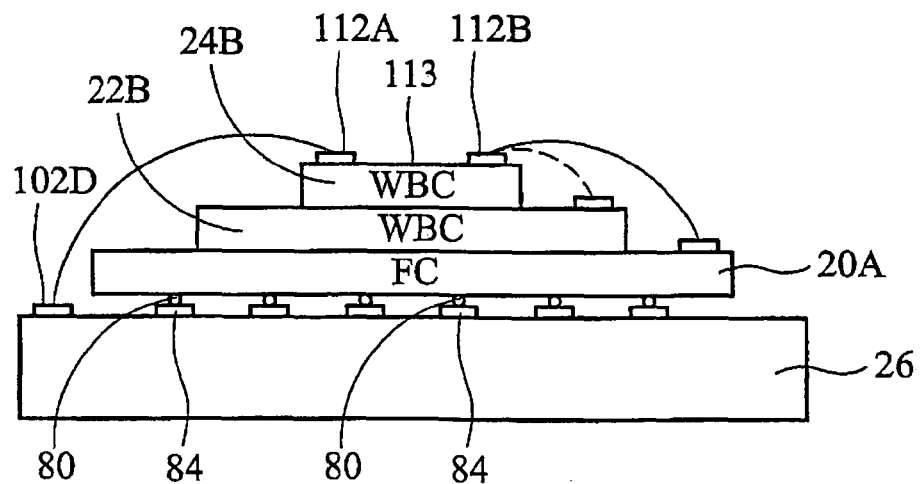

Referring to FIG. 12, there is a circuitry shown similar to that of FIG. 11, except that the third level chip is also a wire bond chip 24b. Therefore, in addition to all the connections discussed above with respect to FIG. 11, and as shown in FIG. 12, there may be a direct connection from a wire bond pad 112a on the top side 113 of wire bond chip 24b directly to a wire bond contact pad 102d on substrate 26. Likewise there may a direct connection from a wire bond pad 112b on the top surface 113 of wire bond chip 24b to either the top surface of wire bond chip 22b or to the back side of flip chip 20a. As was discussed above with respect to FIG. 11, all of the possible connections between the second level wire bond chip 22b to the flip chip 20a and the substrate 26 are also still possible with the embodiment shown in FIG. 12.

Figure 13:
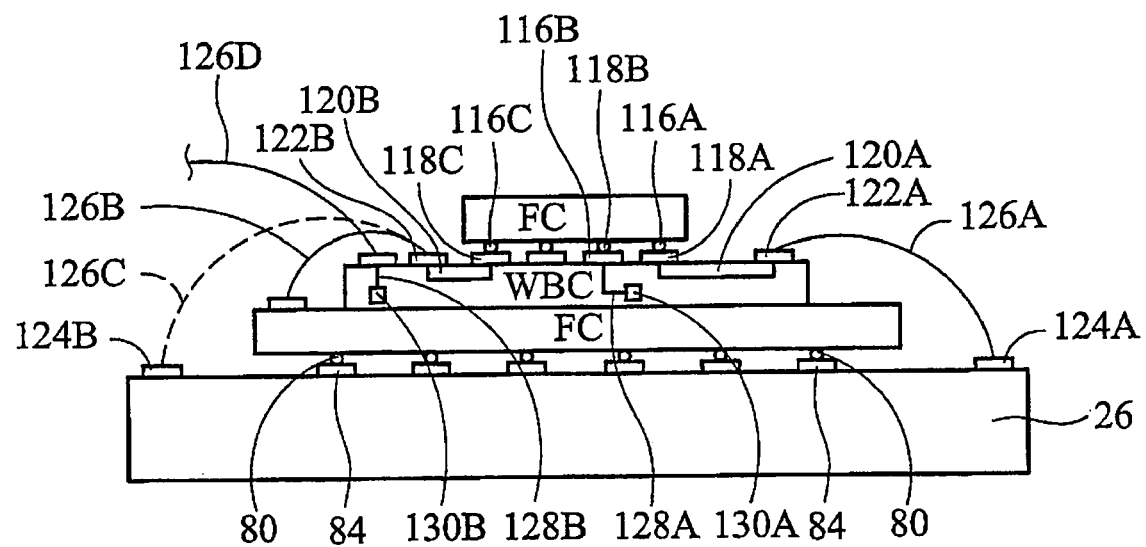

FIG. 13 is similar to the circuitry of FIG. 12 except that the third level chip is a flip chip 24a. Therefore as shown, there is a first level flip chip 20a, a second level wire bond chip 22b, and a third level flip chip 24a.

Referring now to FIG. 13, there are shown examples of the various connections. As has been discussed above with regard to FIGS. 3A, 3B, and 5, and as will be appreciated by those skilled in the art, a flip chip, FC, requires a matching set of contact pads on the chip below it, i.e. flip chip 24a requires a mirror image set of contacts on wire bond chip 22b. Therefore, various connections that could be made with this arrangement include a first typical arrangement where bump contact 116a is electrically connected to a contact pad 118a, which in turn is connected by a trace 120a to a wire bond pad 122a. The wire bond pad 122a is then shown as being connected to a contact pad 124a on the substrate or connection surface 26 by a connecting wire 126a. There is also shown a bump contact 116b, which is in electrical contact with a contact pad 118b, which is directly connected by an internal via 128 to a circuit 130a in the wire bond chip 22b. Bump contact 116c of flip chip 24a is shown in electrical contact with contact pad 118c and in turn in contact with wire bond pad 122b by a trace 120b. Wire bond pad 122b may then be connected to a wire bond pad on flip chip 20a by a wire 126b (solid line), or alternately wire bond pad 122b may be connected to a contact pad 124b on the connection surface or substrate 26 by a connecting wire 126c shown partially in dotted lines. Further in the same manner as discussed above with respect to FIG. 12, a circuit 130b internal to the wire bond chip 22b may be connected by a via 128b to wire bond pad 122c. Wire bond pad 122c may be connected, as discussed above, to any suitable terminal on flip chip 28a or on substrate 26 by connecting wire 126d.

Figure 14:
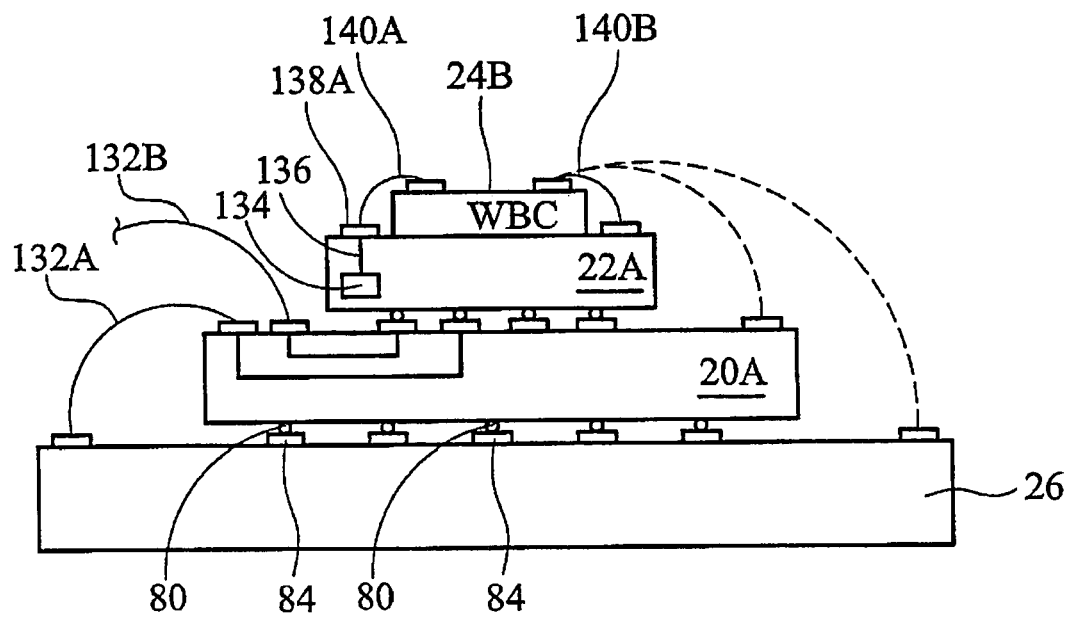

Referring now to FIG. 14, there is shown a stack of chips wherein the first chip is a flip chip 20a, the second chip is a flip chip 22a, and the third chip is a wire bond chip 24b.

As shown in FIG. 14, flip chip 20a on the first level includes contact pads, traces, and terminal points on its back side such that the bump contacts on flip chip 22a may be connected by wire 132a to substrate or connection surface 26 or to any other connection as illustrated by wire 132b. It should also be noted that this example illustrates the double level of metallazation on the back side of flip chip 20a. Flip chip 22a is also shown having connections on the back side. More particularly, flip chip 22a is shown having a circuit 134 connected by an internal via 136 to a bonding pad 138a on the back side of flip chip 22a. In the embodiment shown, bonding pad 138a is connected to the wire bond chip 24b by a connecting wire 140a. Similarly as shown, a connecting wire 140b may be connected from wire bond chip 24b to the back side of flip chip 22a as shown by a solid line, the back side of flip chip 20a as shown by a dashed line, or to the substrate or connecting surface 26 as shown by a dotted line.

Figure 15:
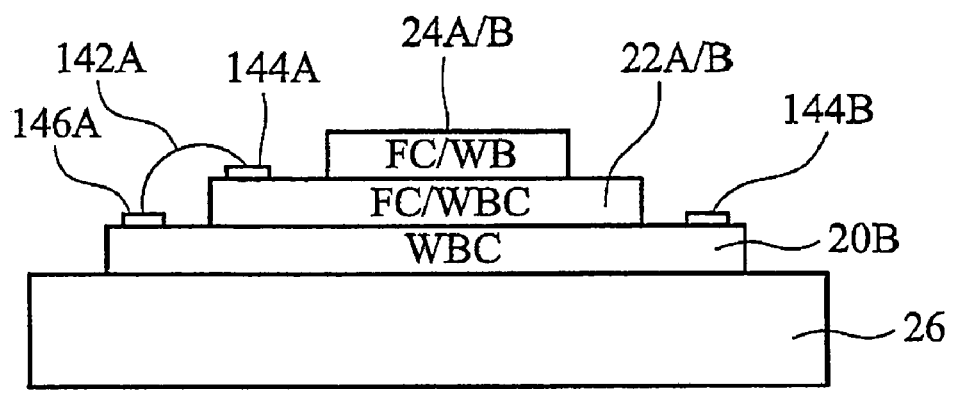
FIG. 15 illustrates a second embodiment of the invention wherein the first level IC is a wire bond (WB) chip.

Referring now to FIG. 15, there is shown an embodiment where the first level chip is a wire bond chip 20b, and wherein the second chip may be a flip chip (22a) or wire bond chip (22b) as indicated by reference numerals 22a/b. Similarly, the third level chip may be a flip chip or a wire bond chip as indicated by reference numbers 24a/b. However, as was discussed above, at least one of the second or third level chips is to be a flip chip. Therefore as shown, the connecting wire bond chip 20b may be connected to the substrate or connecting surface 26 by means of connecting wire 142a, which extends between wire bond pad 144a to a contact pad 146a on the surface of the substrate in a well-known manner. However, as will be discussed later, the wire bond chip top side will include additional wire bond pads such as wire bond pad 144b, which may be connected to circuits in the chips of the second and third level.

Figure 16:
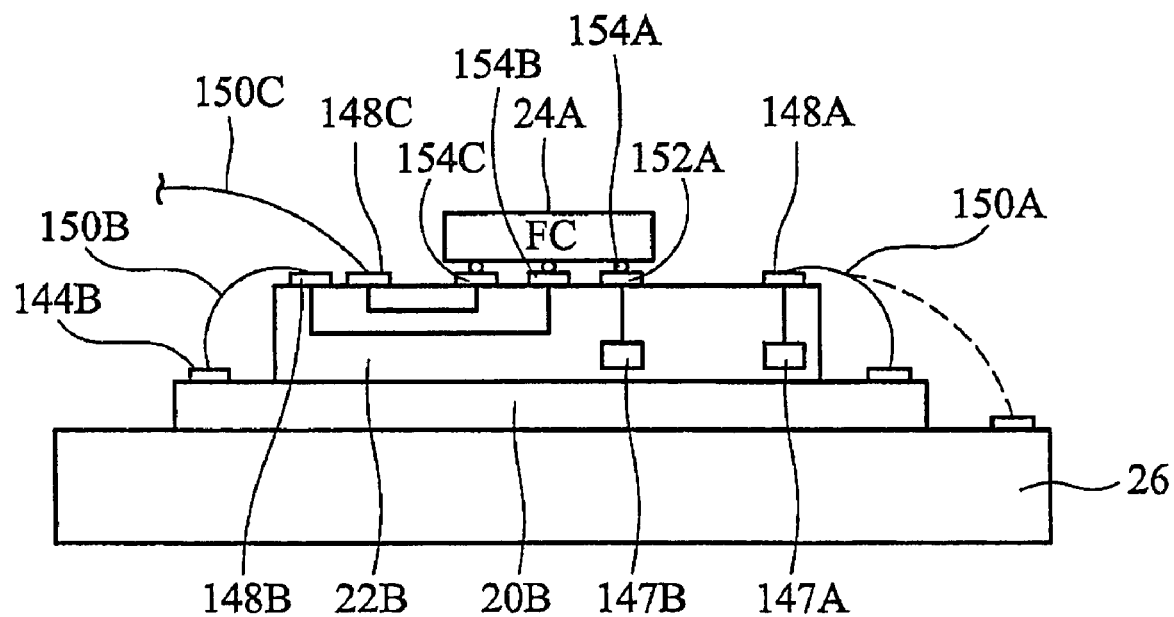
FIGS. 16-19 are side views of the basic arrangement of FIG. 15 and illustrate various chip arrangements and connections of a three IC chip stack wherein at least one level of the second and third level of IC chips is a FC.

Referring to FIG. 16, there is shown a specific example of the circuitry of FIG. 15 wherein the second level chip is a second wire bond chip 22b and the third level chip is a flip chip 24a. It will be appreciated of course that the wire bond chip 20b is connected to the substrate or connection surface 26 in a manner discussed above with respect to FIG. 15. In addition, wire bond chip 22b is shown having an internal circuit 147a connected to a wire bond pad 148a on the back side or top side of wire bond chip 22b, which in turn is connected by a connecting wire 150a to either the top side of wire bond chip 20b, as shown by the solid line, or to the connection surface or substrate 26, as shown by the dashed line. Similar to the other embodiments shown above, wire bond chip 22b further includes contact pads such as contact pad 152a, which is connected to flip chip 24a by a bump contact such as bump contact 154a. Contact pad 152a, in the embodiment shown in FIG. 16, is connected to a second internal circuit 147b of the wire bond chip 22b by an internal via. Further in a manner that has already been discussed, bump contacts 154b and 154c are connected to bonding pads 148b and 148c such that the flip circuits in the flip chip 24a may be connected in various arrangements as necessary and as discussed above. In the embodiment shown, the bonding pad 148b is connected by a connecting wire 150b to a wire bond pad 144b on the wire bond circuitry 22b. Similarly, wire bond pad 148c may be connected by a connecting wire 150c as necessary.

Figure 17:
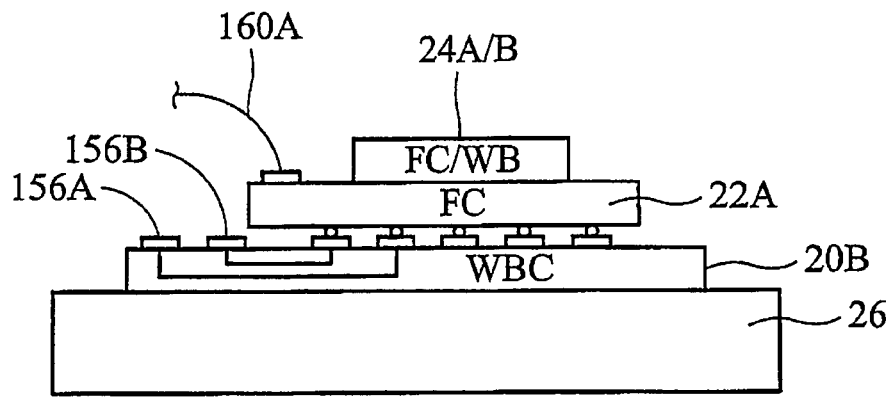

FIG. 17 illustrates an embodiment wherein the first chip is a wire bond chip 20b, the second chip is a flip chip 22a, and the third chip may be either a flip chip or a wire bond chip 20a/b. Therefore, in addition to the connections discussed above with respect to FIG. 15, the embodiment of FIG. 17 illustrates how the top side of wire bond chip 20b may include contact pads as discussed in FIG. 4C above, as well as multilevel conductive traces for providing connections to the circuits of the flip chip 22a. As shown, the bump contacts of flip chip 22a are in electrical contact with contact pads on the back side of wire bound chip 20b and connected by double level traces to the bonding pads 156a and 156b. Similarly, the back side of flip chip 22a will include bonding pads, such as bonding pad 158, for providing output lines, such as output line 160a, for the flip chip or wire bond chip 20a/b.

Figure 18:
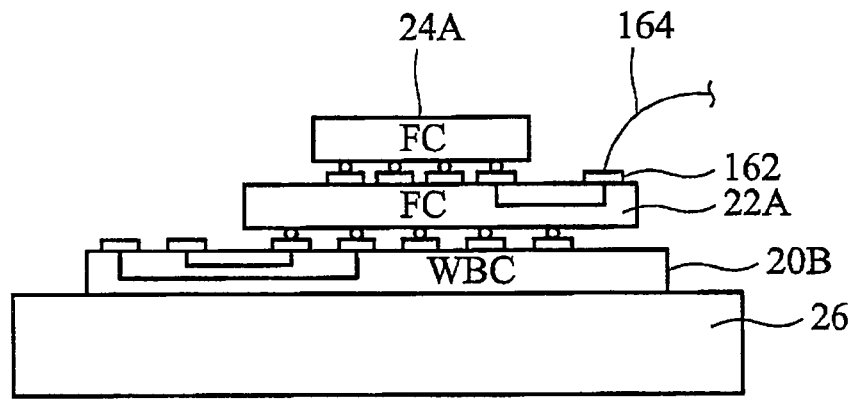
Figure 19:
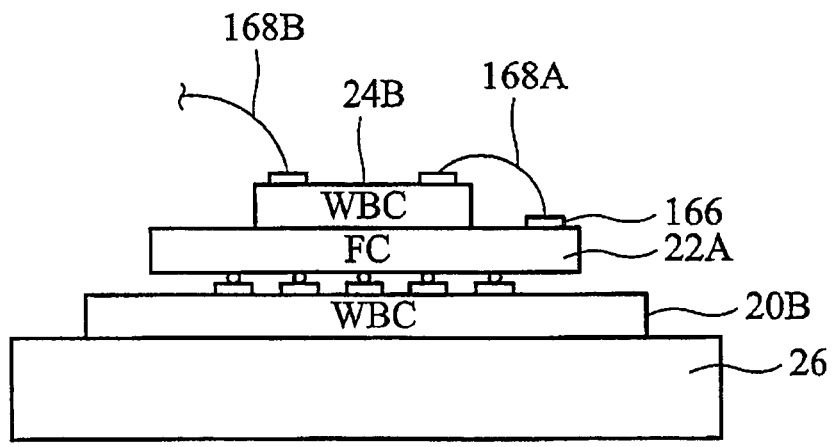

The circuit of FIG. 18 illustrates the arrangement wherein the first level chip is a wire bond chip and the second and third level chips 22a and 24a are both flip chips. The connections for this circuitry are substantially the same as in FIG. 17, except that the back side of flip chip 22a also includes bonding pads 162, which provide output lines 164 for the third level flip chip 24a. FIG. 19 is substantially the same as that discussed in FIG. 18, except the back side of flip chip 22a does not need to provide output connections for the wire bond chip 24b. For example, wire bond chip 24b may be connected in a normal manner to a bonding pad 166 on the back side of flip chip 22a if desired. However, wire bond chip may also be connected by a connecting wire 168b to any other suitable connection including the top side of wire bond chip 20b or the substrate 26. Of course the flip chip 22a may include any of the connections discussed above with respect to FIG. 18.

Figure 20A:
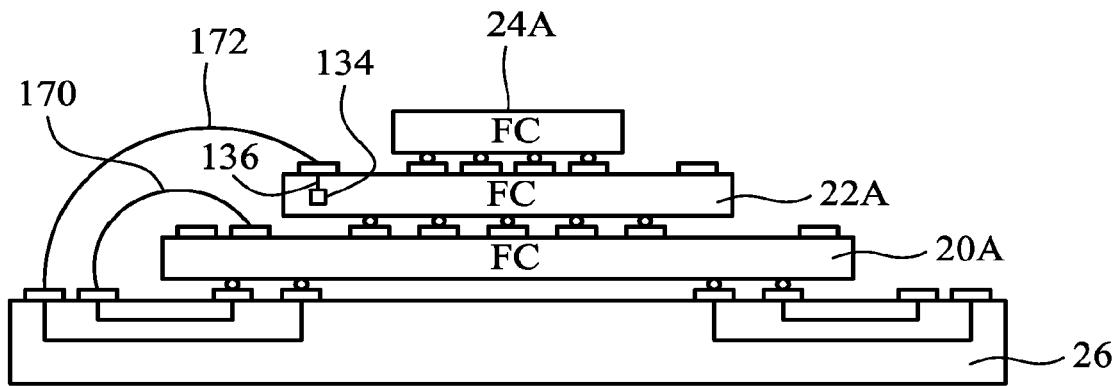
FIG. 20A shows a stack of three flip chips with various electrical connections according to the teaching of the present invention.

Referring now to FIG. 20A, there is still another embodiment of the present invention that is substantially similar to that discussed with respect to FIG. 14, except that the third level integrated circuit is also a flip chip 24a. Therefore, in addition to the contact pads, traces, and wire bond connection pads on the first level flip chip 20a, there are also, of course, bonding pads on the back side of the second flip chip 22a that can be used to provide output connections for the third flip chip 24a. Thus, as shown, there is a connecting wire 170 between a bonding connection on the back side of flip chip 20a to a connection pad on substrate or connecting surface 26. Likewise, it is seen that the back side of flip chip 22a will also include bonding pads for providing outputs to the third flip chip 24a. Thus, there is also shown a connecting wire 172 connected to the back side of flip chip 22a to, still, another bonding connection on substrate or connecting surface 26.

Figure 20B:
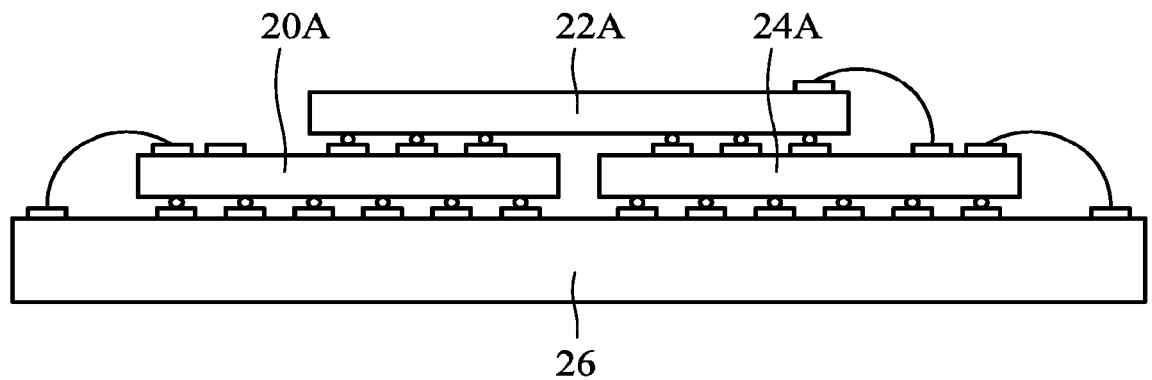
FIG. 20B also shows three flip chips except two of the three chips are at a first level and the third is at a second level and provides a bridge across the two at the first level.

FIG. 20B also comprises three flip chips. However, the bump controls of the third flip chip 24a are in contact with another set of contact pads on the connection surface or substrate 26. Also as shown, the backside of the third flip chip 24a also includes contact pads that are in electrical contact with another portion of the bump contacts on the second flip chip 22a. Thus, the second flip chip bridges and is in electrical contact with both the first flip chip 20a and the third flip chip 24a.

Figure 21:
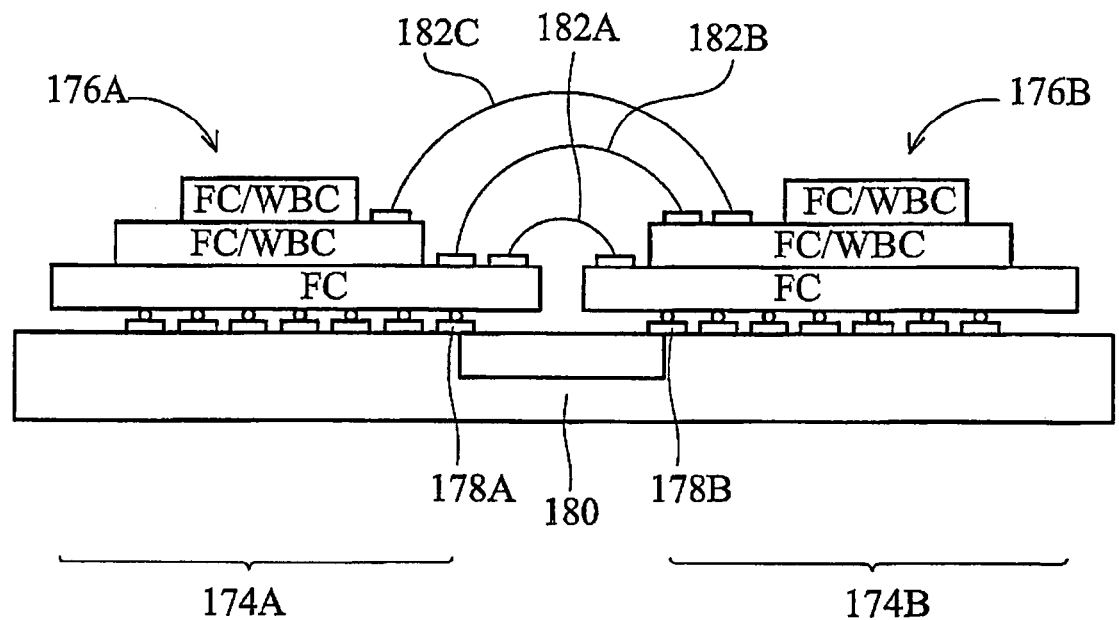
FIGS. 21 and 22 illustrate packaging and connections of two or more sub-packages similar to those discussed above with respect to FIGS. 2 and 11-14 contained in a single package.

FIG. 21 illustrates a more complex arrangement wherein the substrate includes multisets of contact pads such as contact pad sets 174a and 174b. In the example of FIG. 21, the two sets of contact pads provide electrical contact between the two stacks of integrated circuits 176a and 176b. For example, if the first level is a flip chip, the remaining levels may be any of the other embodiments discussed above wherein the first level was a flip chip and the second and third levels were various combinations of flip chips and/or wire bond chips. There may be connections between the first stack of integrated circuits 176a by means of a contact pad 178a through a trace 180 to another contact pad 178b to a circuit on the second stack of integrated circuits. Also as shown, additional connecting wires such as connecting wires 182a, 182b, and 182c can bridge between different levels of the two stacks of flip chips. In addition, the above concept can also be applied to a structure, where the first level of the two stacks comprise wire bond chips or where the first level of one stack is a flip chip and the first level of the second stack is a wire bond chip.

Figure 22:
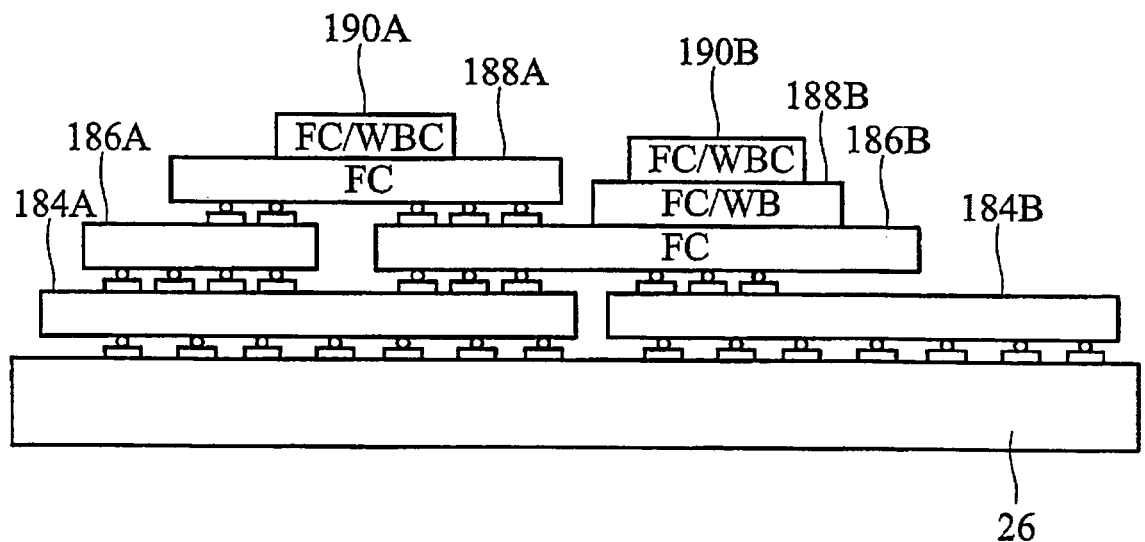

FIG. 22 shows still more complex arrangements of flip chips and wire bond chips according to the teachings of this invention. As shown, the substrate or connecting surface 26 and the first level of flip chips 184a and 184b is similar to the structure discussed above with respect to FIG. 21. However, in addition to the typical arrangement of chip 186a with respect to flip chip 184a, which is similar to those embodiments discussed above, there is a second level flip chip 186b that bridges the first level flip chips 184a and 184b. There is also shown a third level flip chip 188a that bridges the second level flip chips 186a and 186b. A fourth layer chip stacked on top of flip chip 188a may be either another flip chip or a wire bond chip. Similarly, there is shown a third and fourth level chips 188b and 190b, which illustrate that both the third and the fourth level integrated circuits may be either a flip chip or a wire bond chip. Although not illustrated in FIG. 27, wire bond connections could also be provided between different stacks of ABC (e.g. WBC 190a and WBC 190b) in the same manner as discussed in FIG. 21. It will of course be appreciated that the particular arrangement of FIG. 22 is for illustration only and is not intended to be limiting. For example, different combinations of flip chips, wire bond chips, and flip chips that bridge other integrated circuits, including other flip chips or other wire bond chips, are intended to be included in the scope of this invention.

Although the present invention and its advantages have been described in detail, it should be understood that various changes, substitutions and alterations can be made herein without departing from the spirit and scope of the invention as defined by the appended claims.

Moreover, the scope of the present application is not intended to be limited to the particular embodiments of the illustrated circuits, methods and steps described in the specification. As one of ordinary skill in the art will readily appreciate from the disclosure of the present invention and circuit connections presently existing or later to be developed, that perform substantially the same function or achieve substantially the same result as the corresponding embodiments described herein may be utilized according to the present invention. Accordingly, the appended claims are intended to include within their scope such processes and circuit arrangements.

What is claimed is:

1. An electronic package that includes a multiplicity of stacked electronic flip chip circuits, said package comprising:

a connection surface or substrate defining first electrical traces and second electrical traces thereon, said first electrical traces extending from first wire bond pads to first contact pads, said second electrical traces extending from second wire bond pads to fourth contact pads;

a first flip chip having an active side and a back side, said active side comprising first electrical circuits connected to a first multiplicity of bump contacts on said active side, said multiplicity of bump contacts in electrical contact with said first contact pads and fourth contact pads on said connection surface, said back side of the first flip chip defining electrical traces extending from second contact pads and electrically connected to third wire bond pads;

a second flip chip having an active side and a back side and having second electrical circuits connected to a second multiplicity of bump contacts on said active side, said second multiplicity of bump contacts positioned to be in electrical contact with said second contact pads on said first flip chip, said back side of the second flip chip comprising third contact pads and fourth wire bond pads, said second flip chip comprising a via connecting an active circuit on said active side of the second flip chip to either the third contact pads or the fourth wire bond pads;

a third flip chip including a third multiplicity of bump contacts in electrical contact with said third contact pads;

at least one wire bond connected between one of said third wire bond pads on said back side of said first flip chip and one of said second wire bond pads on said connection surface; and at least one second wire bond connected directly between one of said fourth wire bond pads on said back side of said second flip chip and one of said first wire bond pads on said connection surface.

2. The electronic package of claim 1 wherein said third contact pads are on said backside of said second flip chip such that said third flip chip is stacked on top of said second flip chip, and wherein said third contact pads are connected by electrical traces to said fourth wire bond pads.

3. The electronic package of claim 2 further comprising an electrical connection between one of said second electrical circuits and one of said third contact pads on said back side of said second flip chip.

4. The electronic package of claim 1 further comprising at least one wire bond connected between said back side of said second flip chip and said second wire bond pads on said connection surface.

5. An electronic package that includes a multiplicity of stacked electronic flip chip circuits, said package comprising:
a connection surface or substrate defining electrical traces thereon, said electrical traces extending from first wire bond pads to first contact pads, and further comprising second wire bond pads;
a first flip chip having an active side and a back side, said active side comprising first electrical circuits connected to a first multiplicity of bump contacts on said active side, said multiplicity of bump contacts in electrical contact with said first contact pads on said connection surface, said back side of the first flip chip defining electrical traces extending from second contact pads and electrically connected to third wire bond pads;
a second flip chip having an active side and a back side and having second electrical circuits connected to a second multiplicity of bump contacts on said active side, said second multiplicity of bump contacts positioned to be in electrical contact with said second contact pads on said first flip chip and fourth wire bond pads located on the back side of the second flip chip;
a third flip chip including a third multiplicity of bump contacts in electrical contact with third contact pads, said third contact pads on said connection surface;
at least one wire bond connected between one of said third wire bond pads on said back side of said first flip chip and one of said second wire bond pads on said connection surface; and
at least one wire bond connected between said third wire bond pads on said first flip chip and fourth wire bond pads;
wherein said back side of said third flip chip further includes fourth contact pads and wherein said second flip chip further includes a fourth multiplicity of bump contact positioned to be in contact with said fourth contact pads on said third flip chip such that said second flip chip bridges and connects to both said first and third flip chips.

6. An electronic package having a stacked plurality of electronic circuit chips comprising:
a connection surface defining contact pads for electrically connecting at least one of said plurality of electronic circuit chips;
at least one flip chip in said stacked plurality of electronic circuit chips;
a back side surface on said flip chip having wire bond pads;
at least one wire bond connected between one of said wire bond pads on said back side surface on said flip chip and a second wire bond pad on a back side surface of a second chip of said stacked plurality of electronic circuit chips;
a third chip located between the second chip and the connection surface, the third chip being connected to the contact pads through first bump contacts on a first side and also connected to the second chip through second bump contacts on a second side; and
at least one wire bond connected directly between one of said wire bond pads on said back side surface of said second chip and a third wire bond pad on said connection surface, wherein the third wire bond pad is connected to at least one of the contact pads.

* * * * *